US008492220B2

(12) United States Patent
Erickson et al.

(10) Patent No.: US 8,492,220 B2
(45) Date of Patent: Jul. 23, 2013

(54) VERTICALLY STACKED FETS WITH SERIES BIPOLAR JUNCTION TRANSISTOR

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 12/852,811

(22) Filed: Aug. 9, 2010

(65) Prior Publication Data

US 2012/0032274 A1 Feb. 9, 2012

(51) Int. Cl.
*H01L 21/8249* (2006.01)

(52) U.S. Cl.
USPC .............. 438/234; 438/341; 257/E21.696

(58) Field of Classification Search
USPC ............ 438/234, 235, 341; 257/366, 373, 257/374, 378, E29.183, E21.696
See application file for complete search history.

(56) References Cited

U.S. PATENT DOCUMENTS

| | | | | |
|---|---|---|---|---|
| 3,535,599 A | | 10/1970 | Deak | |
| 4,500,905 A | | 2/1985 | Shibata | |
| 4,603,468 A | * | 8/1986 | Lam | 438/153 |
| 4,654,121 A | * | 3/1987 | Miller et al. | 438/153 |
| 4,679,299 A | * | 7/1987 | Szluk et al. | 438/153 |
| 4,686,758 A | * | 8/1987 | Liu et al. | 438/153 |
| 5,714,394 A | * | 2/1998 | Kadosh et al. | 438/199 |
| 5,834,354 A | * | 11/1998 | Kadosh et al. | 438/305 |
| 5,863,818 A | * | 1/1999 | Kadosh et al. | 438/152 |
| 5,872,029 A | * | 2/1999 | Gardner et al. | 438/152 |
| 6,075,268 A | * | 6/2000 | Gardner et al. | 257/327 |
| 6,259,118 B1 | * | 7/2001 | Kadosh et al. | 257/67 |
| 6,392,253 B1 | | 5/2002 | Saxena | |
| 7,002,207 B2 | | 2/2006 | Kim et al. | |
| 7,282,406 B2 | | 10/2007 | Grivna et al. | |
| 7,537,980 B2 | | 5/2009 | Son et al. | |
| 7,547,917 B2 | * | 6/2009 | Gauthier et al. | 257/67 |
| 2002/0096690 A1 | | 7/2002 | Nemati et al. | |
| 2006/0054943 A1 | | 3/2006 | Li et al. | |
| 2010/0252868 A1 | | 10/2010 | Allen et al. | |
| 2010/0308413 A1 | | 12/2010 | Paone et al. | |
| 2011/0204428 A1 | | 8/2011 | Erickson et al. | |
| 2011/0248349 A1 | * | 10/2011 | Christensen et al. | 257/369 |
| 2011/0298052 A1 | * | 12/2011 | Erickson et al. | 257/368 |
| 2012/0032274 A1 | | 2/2012 | Erickson et al. | |

OTHER PUBLICATIONS

IBM U.S. Appl. No. 12/416,264, David H. Allen, et al., "Enhanced Field Effect Transistor" filed Apr. 1, 2009.
IBM U.S. Appl. No. 12/478,098, Phil C. Paone, et al., "3-D Single Gate Inverter" filed Jun. 4, 2009.
IBM U.S. Appl. No. 12/712,521, Karl R. Erickson, et al., "Implementing EDRAM Stacked FET Structure" filed Feb. 25, 2010.

(Continued)

*Primary Examiner* — David Vu
*Assistant Examiner* — Earl Taylor
(74) *Attorney, Agent, or Firm* — Robert R. Williams

(57) ABSTRACT

Vertically stacked Field Effect Transistors (FETs) are created on a vertical structure formed on a semiconductor substrate where a first FET and a second FET are controllable independently. A bipolar junction transistor is connected between and in series with the first FET and the second FET, the bipolar junction transistor may be controllable independently of the first and second FET.

1 Claim, 11 Drawing Sheets

OTHER PUBLICATIONS

IBM U.S. Appl. No. 12/757,145, Todd A. Christensen, et al., "Vertical Stacking of Field Effect Transistor Structures for Logic Gates" filed Apr. 9, 2010.

IBM U.S. Appl. No. 12/793,118, Karl R. Erickson, et al., "Vertical Stacking of Field Effect Transistor Structures for Logic Gates" filed Jun. 3, 2010.

* cited by examiner

Vertical Structure formed by etching to define gate stack. Mask gate region and one end of "dog bone"; etch the other end of the "dog bone" for contact to Metal 106

Fig. 3   Deposit enough SiO₂ to "bury" Vertical Structure 100, then planarize

Etch SiO₂ to expose top HfO₂ and gate contacts
Etch Holes 121 to expose vertical sides of vertical structure for further processing

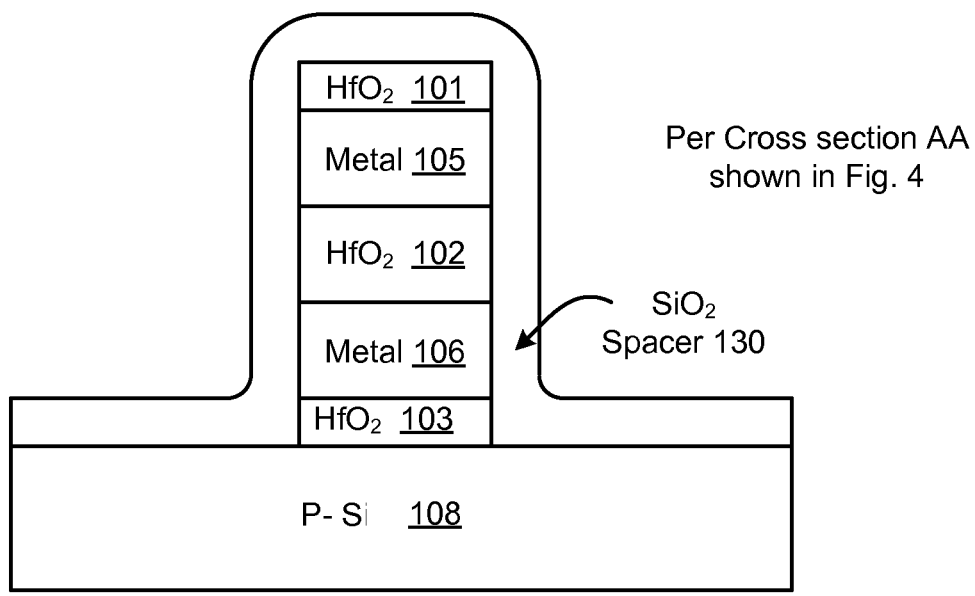
Fig. 5  Deposit Spacer
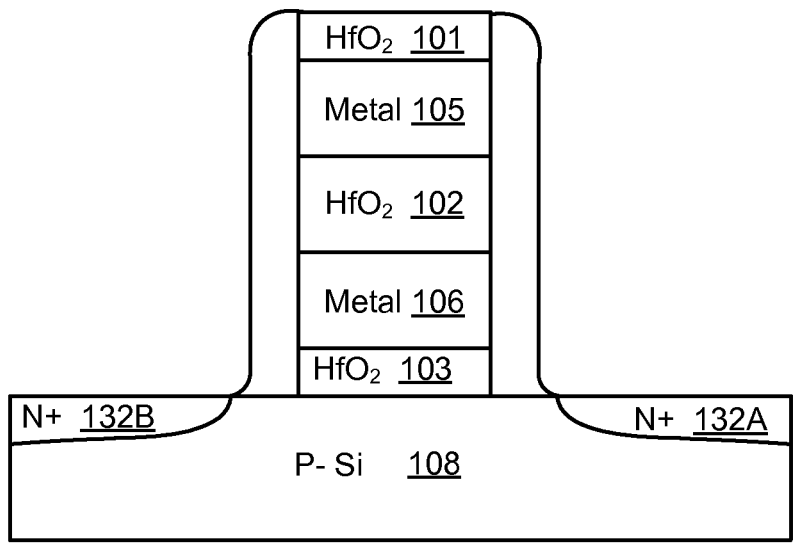
Fig. 6  Anisotropically etch spacer
Implant Source/drain

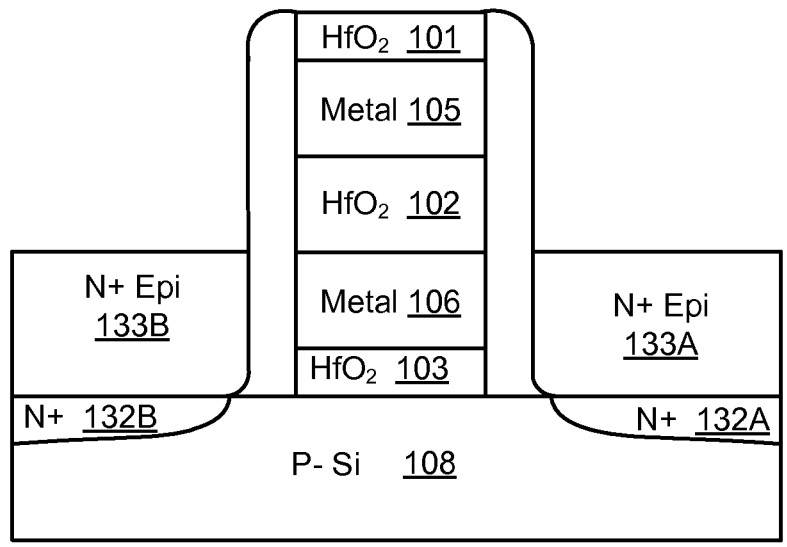
Fig. 7   Grow First Epitaxial Silicon Layer
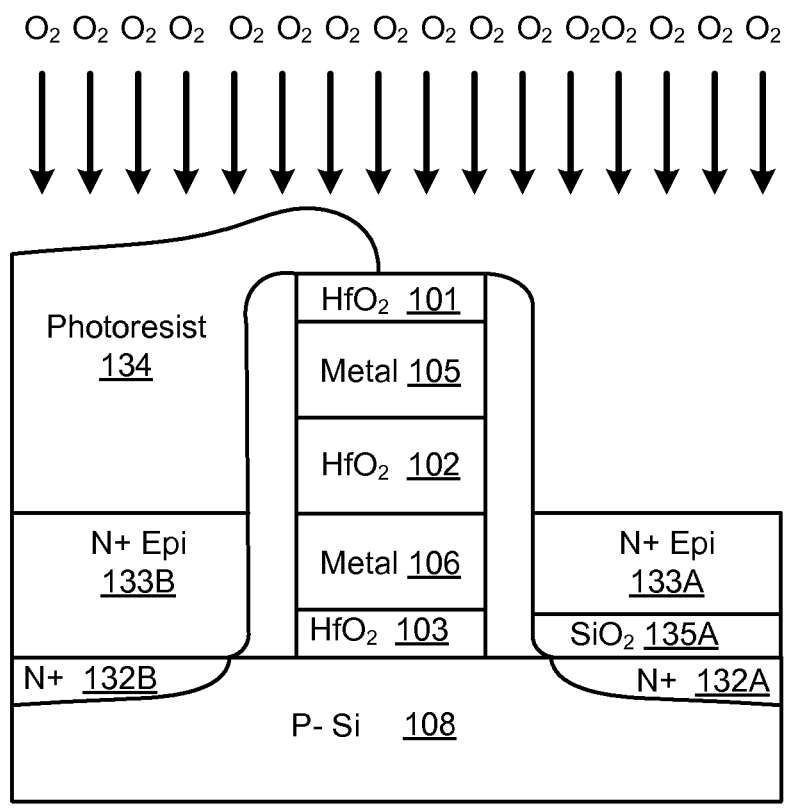
Fig. 8   Implant O₂ to create SiO₂ 135 to break a N+ 132 to N+ Epi 133 connection as shown Remove Photoresist
Grow P epitaxial silicon (for BJT base)

Grow N+ epitaxial silicon, then grow P- epi silicon to cover top of HfO₂ 101

Planarize

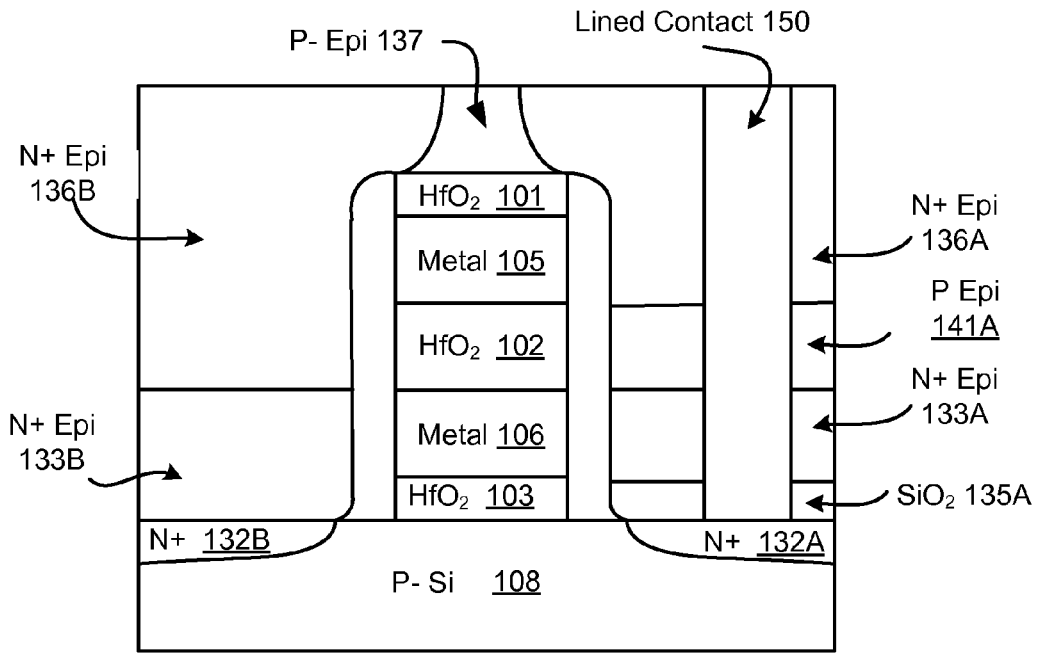
Fig. 12  Etch Lined Contact Hole
--silicon etch
--$SiO_2$ etch
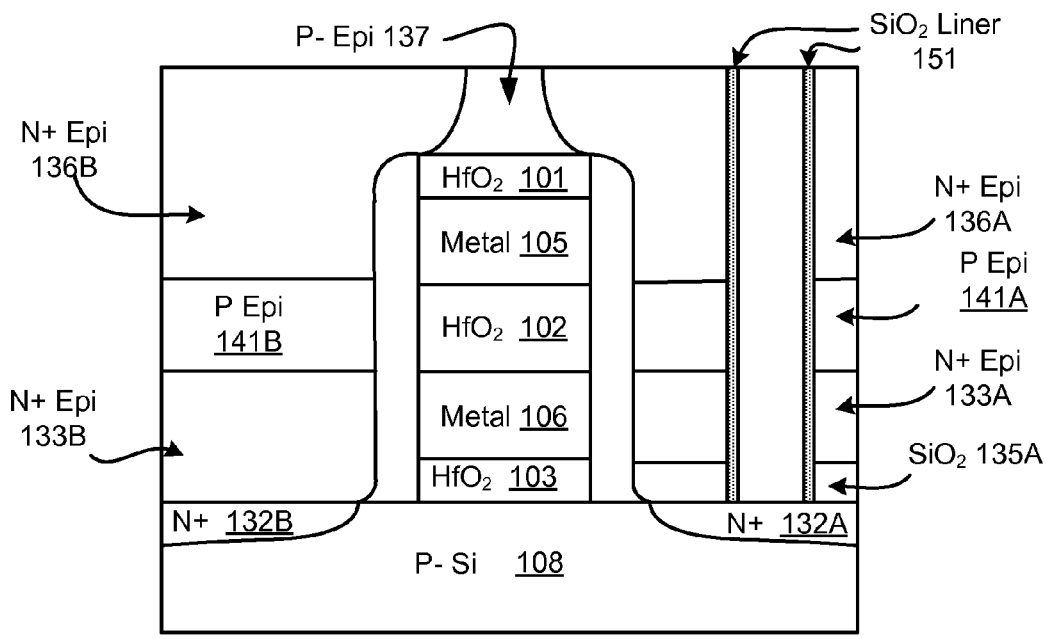
Fig. 13  Line Lined Contact hole by depositing $SiO_2$ Liner Fill Lined Hole with Conductive Material to make Contact 149

Create SiO2 142B Using Mask and Oxygen Implant Similar to creation of SiO2 135A

Create contact 154 similar to Lined Contact Hole150

Schematic overlaid on physical structure
FETs are NFETs
BJT is an NPN

Schematic overlaid on physical structure
FETs are PFETs
BJT is a PNP

US 8,492,220 B2

VERTICALLY STACKED FETS WITH SERIES BIPOLAR JUNCTION TRANSISTOR

FIELD OF THE INVENTION

This invention relates generally to semiconductor chips and, more particularly to dense structures comprising more than one field effect transistor (FET) and at least one bipolar junction transistor.

SUMMARY OF EMBODIMENTS OF THE INVENTION

Semiconductor chips are expensive to manufacture. Therefore, it is important to place as much function as possible on a semiconductor chip of a given area. Engineers constantly strive to place logic gates as densely as possible. Embodiments of the current invention vertically stack at least two Field Effect Transistors (FETs) and at least one bipolar junction transistor (BJT) on a vertical structure to improve density. In particular, embodiments of the invention provide for stacking N-channel Field Effect Transistors (NFETs) and for stacking P-channel Field Effect Transistors (PFETs). One or more BJT transistors formed on a vertical surface of the vertical structure may be coupled in series with the FETs on the vertical structure. When the FETs are NFETs, the BJT is an NPN BJT; when the FETs are PFETs, the BJT is a PNP BJT. The FETs are independently controllable and can be used for, e.g., an NFET portion of a NAND circuit or a PFET portion of a NOR circuit. The series BJT is also independently controllable. For exemplary purposes hereinafter, NFETs and NPNs will be used; however it is understood that PFETs and PNPs may be constructed in the same manner, with appropriate dopings in the semiconductor structures used to create the FETs and BJTs.

Vertically stacked FETs are constructed on a semiconductor substrate. A first FET on the semiconductor substrate has a first source, a first drain, a first gate dielectric, a first body, and a first gate electrode. A second FET has a second source, a second drain, a second gate dielectric, a second body, and a second gate electrode. The first and second gate electrodes may be connected to different logical signals. The second gate electrode is physically above the first gate electrode relative to a top surface of the semiconductor substrate. A BJT is created on a vertical structure upon which the first and second FETs are created, the BJT being connected in series with the first and second FET.

BRIEF DESCRIPTION OF THE DRAWINGS

FIG. 5 shows the cross section AA identified in FIG. 4. A dielectric ($SiO_2$ shown) spacer has been conformally deposited.

FIG. 6 shows the spacer after an anisotropic etch. Source and drain areas have been implanted.

FIG. 7 shows a first growth of a first epitaxial layer. The doping of the first epitaxial layer is similar to the doping of the source and drain area (i.e., if the source and drain area are N+, then the first epitaxial layer is also N+).

FIG. 8 shows an oxygen implant that creates a $SiO_2$ later isolating a source (or drain) area from the first growth of epitaxial layer. A photoresist layer may be used to prevent $SiO_2$ formation over another source (or drain) area, as shown.

FIG. 12 shows an etching of a hole through the first, second and third epitaxial layers and the $SiO_2$ later of FIG. 8. This etching will be further processed to form a lined contact hole.

FIG. 13 shows the hole of FIG. 12 after deposition of a dielectric liner in the lined contact hole and an anisotropic etch to remove a bottom portion of the dielectric liner.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for vertical structures of field effect transistors in series with a bipolar junction transistor (BJT) suitable for NAND and NOR logic gates. Alternatively, embodiments of the invention provide for enhanced-drive pull up or pull down series structures. Detailed drawings and description focus on N-channel Field Effect Transistors (NFETs) and NPN BJTs; however, it will be clear that a similar process, with appropriate dopings, will create analogous PFET (P-channel Field Effect Transistors), with a series PNP BJT.

Figure 1:
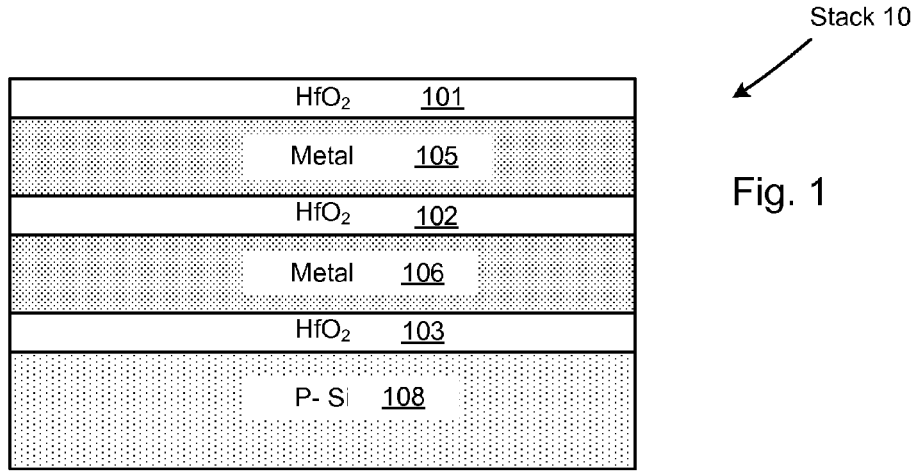
FIG. 1 shows a stack of layers having a silicon substrate (P− silicon assumed). Alternating layers of dielectric material ($HfO_2$ used for exemplary purposes) and FET gate conductor ("metal" used for exemplary purposes) are depicted.

With reference now to FIG. 1, a stack 10 comprises a silicon substrate 108, shown as being doped P−. Silicon substrate 108 forms a substrate for further processing of NFET transistors as will be explained below. It is understood that PFET transistors will be formed above an N− doped region, for example, an N− well in the silicon substrate 108. Alternating layers of a dielectric material (HfO$_2$ shown for exemplary purposes) and gate electrode material (e.g., metal or polysilicon; "metal" used for exemplary purposes) are stacked above silicon substrate 108. HfO$_2$ 101, 102, and 103 are shown in FIG. 1 as the dielectric layers. Metal 105 is layered between HfO$_2$ 101 and HfO$_2$ 102; Metal 106 is layered between HfO$_2$ 102 and HfO$_2$ 103. HfO$_2$ 101 and HfO$_2$ 103 will form gate oxides for a first and a second NFET and therefore need to be of appropriate thickness for gate oxide purposes. HfO$_2$ 102 electrically isolates metal 105 from metal 106 and needs to be of appropriate thickness for this purpose.

Figure 2:
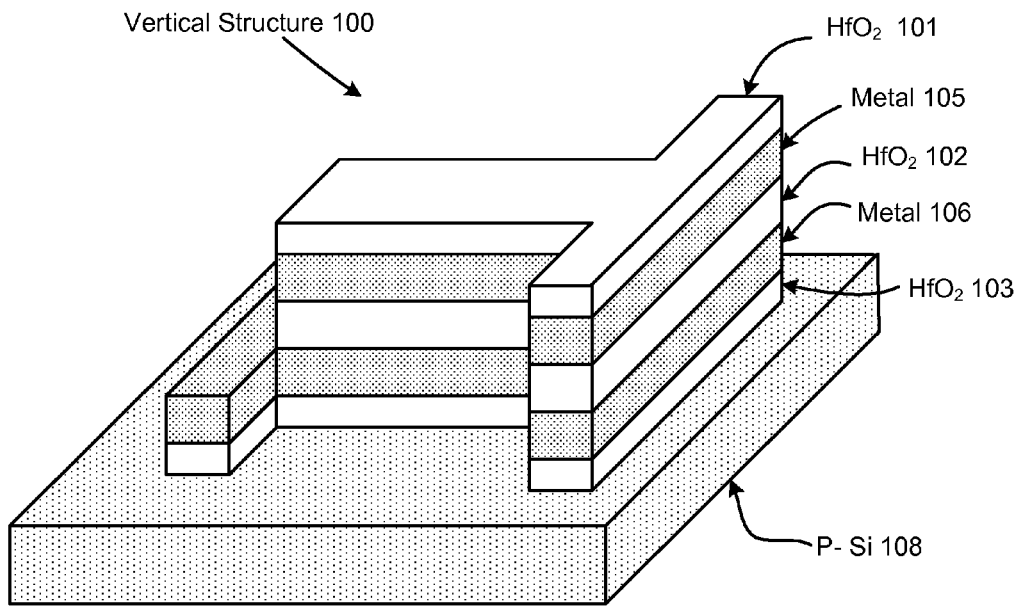
FIG. 2 shows a vertical structure defined in the stack of layers of FIG. 1 in isometric style, further showing how a gate area is formed of the vertical stack. The gate area includes "dog bone" ends suitable for etching and forming contacts with the FET gate conductors.

FIG. 2 shows stack 10 after some processing in a semiconductor fabrication facility to produce a vertical structure 100. Vertical structure 100 is shown as having a "dog bone" shape. A middle area of the "dog bone" shape is an area in which NFETs and an NPN BJT will be created. In the "dog bone", the orthogonal areas (portions) at the ends may be used for contacting the gate electrode material (metal 105, metal 106). A left orthogonal area shows HfO$_2$ 101, metal 105, and HfO$_2$ 102 etched away so that metal 106 can be contacted, for example, with dual contacts. Shapes other than "dog bones" are contemplated for dual contacts, for example, an "L" shape having a portion long enough to have a dual contact. An "L" having a shorter portion may be used if only a single contact is allowed in a particular technology. The right orthogonal area may be used to make contact(s) to metal 105 in a similar manner, and may be etched to provide for contacts to metal 105. For example, the right and left orthogonal areas may be etched at the same time to remove a portion of HfO$_2$ 101. In subsequent etches, the left orthogonal area is further etched, as shown, while the right orthogonal area is masked to prevent further etching. Note that neither the right nor the left orthogonal "dog bone" portion needs to be etched as shown, nor is a "dog bone" always even required. For example, if metal 105 or metal 106 are otherwise connected to a source of a logical signal intended to be applied as a gate voltage on an FET that is created as explained below. For example, metal 105 (or metal 106), during processing in creation of vertical stack 100, may be routed to such a signal source and therefore a "dog bone" and vias to metal 105 or metal 106 is not required.

Figure 3:
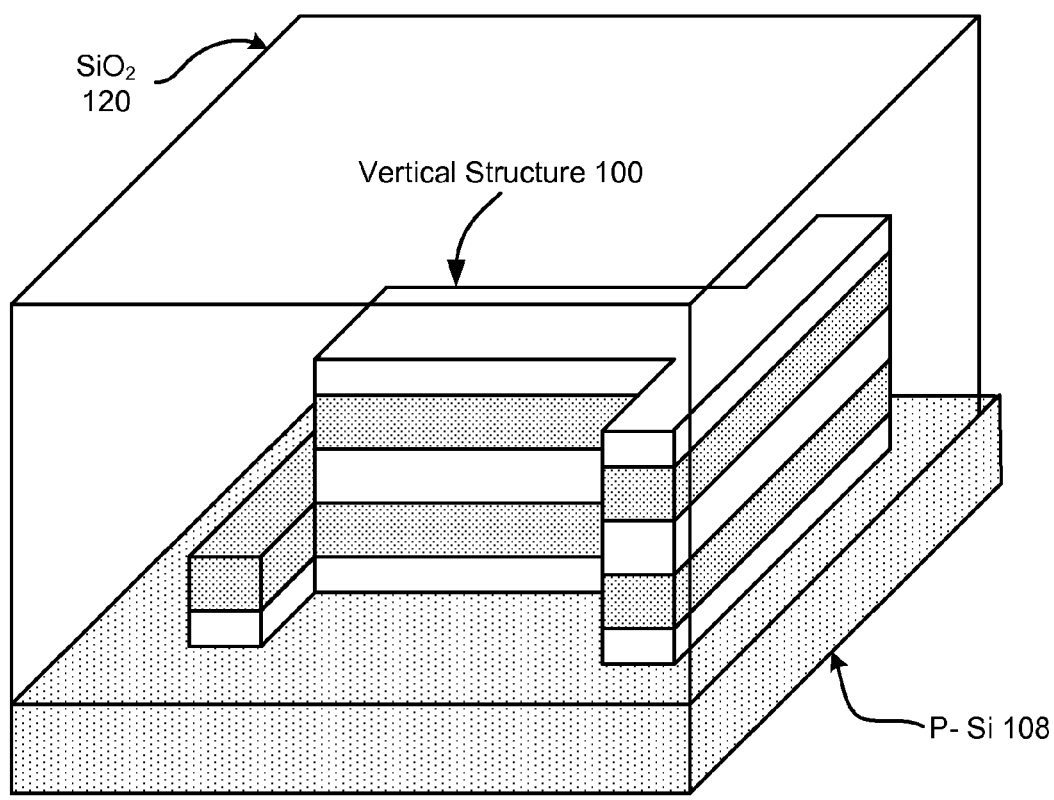
FIG. 3 shows the vertical structure of FIG. 2 further covered in silicon dioxide.

FIG. 3 shows vertical structure 100 after deposition of SiO$_2$ 120, or other suitable dielectric material, to cover vertical structure 100. Note that, for exemplary purposes, the right orthogonal "dog bone" portion is shown as not etched, whereas the left orthogonal "dog bone" portion has been etched. For example, metal 105 (referenced in FIG. 2) may be routed on to a source of a signal on the same metal level and therefore not require a via.

Figure 4:
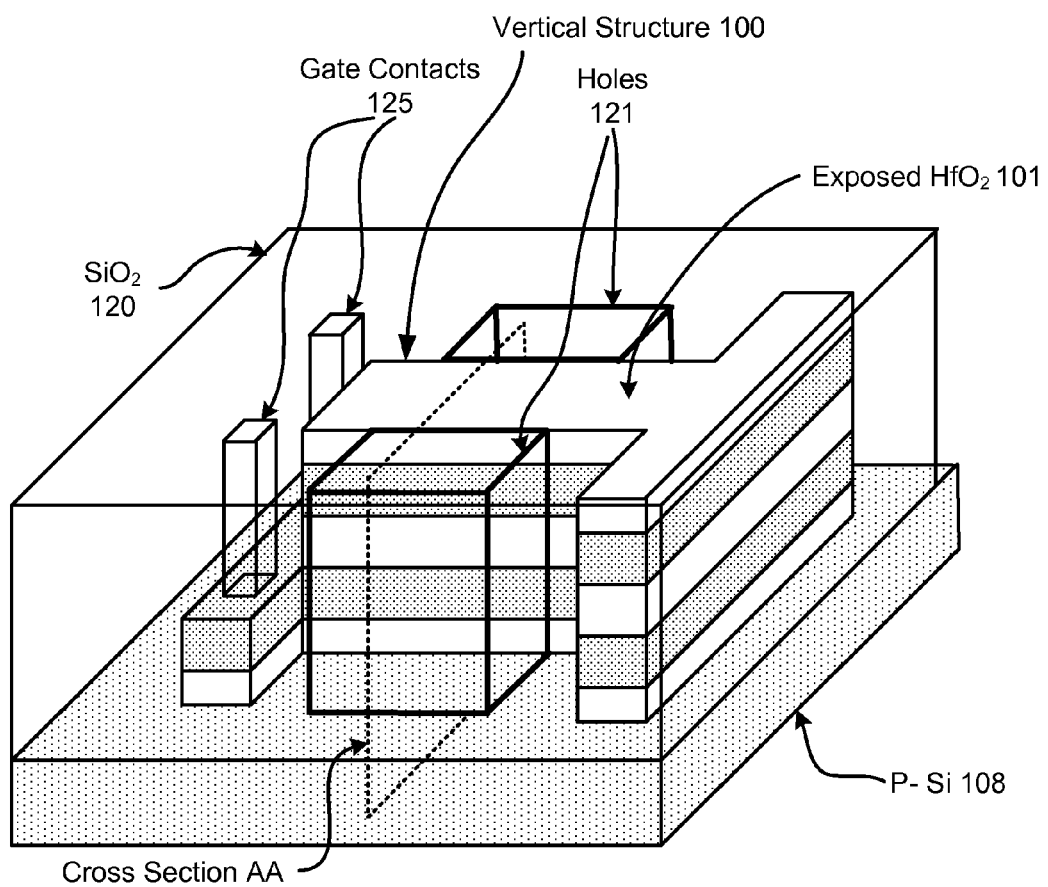
FIG. 4 shows the silicon dioxide etched to expose a top of a top dielectric ($HfO_2$) layer. Two contact holes are shown etched for making contacts to an FET gate conductor. Holes are etched in the silicon dioxide to expose opposing vertical sides of the vertical structure. A cross section AA is identified.

FIG. 4 shows the vertical structure 100 of FIG. 3 after etching SiO$_2$ 120 until a top surface of HfO$_2$ 101 is exposed. Also, holes for gate contacts 125 provide, when filled with conductive material, contacts to metal 106. Holes 121, shown with bold lines, are etched on either side of the remaining vertical structure 100. Holes 121 provide access for subsequent processing that may comprise, for example, depositing spacers, etching the spacers, growing epitaxial regions, as will be explained below. FIG. 4 shows cross section AA which will be used in following figures. Cross section AA cuts through a portion of the remaining vertical structure 100 and holes 121 as depicted.

FIG. 5 shows the structure of FIG. 4 at cross section AA, after conformal deposition of a SiO$_2$ spacer 130.

FIG. 6 shows the structure of FIG. 5 following an anisotropic etch of SiO$_2$ spacer 130. The anisotropic etch bares a top surface of HfO$_2$ 101 and a top surface of P—Si 108. Source/drain regions 132 (132A, 132B) are implanted into P—Si 108. At this stage of the process, source/drain regions 132 (132A, 132B) are the source/drains of a first NFET; HfO$_2$ 103 is a gate dielectric of the first NFET; metal 106 is a gate electrode of the first NFET.

Source/drain regions 132A and 132B are created by the same implant processing step and are generically called source/drain regions 132. However, for clarity as to which source/drain region is intended, a suffix "A" is appended to 132 for the "right hand" (in the drawing) source/drain region 132, and a suffix "B" is appended to 132 for the "left hand" source/drain region 132. A similar convention is used hereinafter to designate "left hand" and "right hand" portions of a particular element.

FIG. 7 shows the structure of FIG. 6 with addition of N+Epi 133 grown over source/drain regions 132. Note the "right hand" and "left hand" "A", "B" suffix convention (133A, 133B). N+Epi 133 has a doping similar to doping of source/drain regions 132. That is, if source/drain regions 132 are doped "N", N+Epi 133 is also doped "N", with appropriate concentration of dopants.

While detail is given herein for creation of NFETs, it will be understood that PFETs may be created in a similar manner, for example starting with an N− Nwell in P− Si 108, P+ implantation forming source/drain regions for a PFET, and P+ epitaxial growth over the source/drain regions of the PFET.

FIG. 8 shows the structure of FIG. 7 with addition of photoresist 134 and an oxygen implant of suitable energy to create SiO$_2$ 135A over source/drain region 132A. Photoresist 134 blocks the oxygen implant from forming a SiO$_2$ 135B over source/drain region 132B, as shown in FIG. 7. SiO$_2$ 135A electrically isolates source/drain region 132A from an overlying N+ epi 133A. Source/drain region 132B remains in electrical connection with similarly doped overlying N+ epi 133B.

Figure 9:
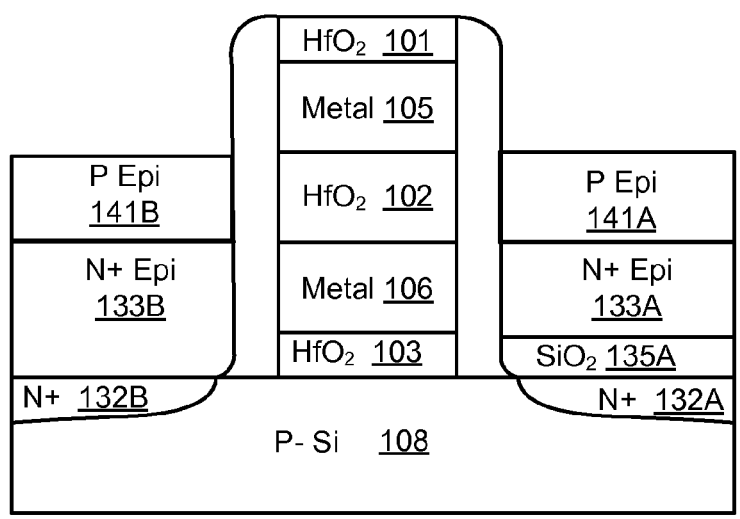
FIG. 9 shows a growth of a second epitaxial layer, the second epitaxial layer doped opposite to the first epitaxial layer, the second epitaxial layer doped with a concentration suitable for a bipolar junction transistor base.

FIG. 9 shows growth of a P epi 141 (141A, 141B) over N+ epi 133. P epi 141 is doped with a concentration suitable for a base of an NPN transistor. N+ epi 133B will form a collector (or emitter, depending on voltage applied) for the NPN transistor.

Figure 10:
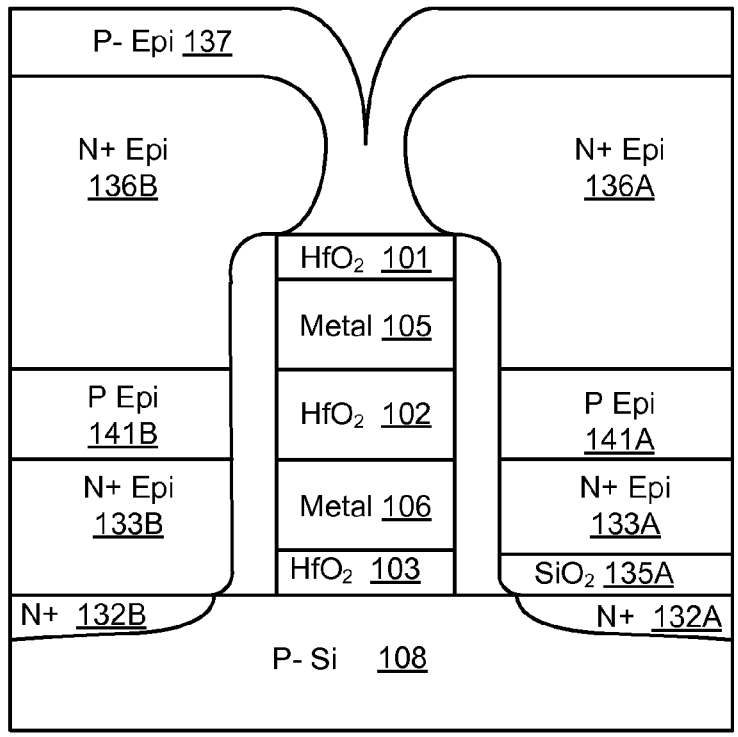
FIG. 10 shows the structure of FIG. 9, with a third epitaxial layer and a fourth epitaxial layer added. The third epitaxial layer is doped similar to doping of the first epitaxial layer. The fourth epitaxial layer is doped similar to the substrate, and is suitably doped for a body region of an FET.

FIG. 10 shows the structure of FIG. 8 with addition of growth of suitably doped epitaxial silicon, N+ epi 136, shown as N+ epi 136A, 136B. N+ epi 136 is grown over P epi 141 until N+ epi 136 grows above the top surface of HfO$_2$ 101. N+ epi 136 will "bulge" slightly over the spacer and a portion of HfO$_2$ 101, as shown. P− epi 137 is grown on N+ epi 136, as depicted. P− epi 137 is grown until the top surface of HfO$_2$ 101 is covered to a suitable depth for a body of a second NFET. The P− epi 137 is of opposite doping to the N+ doping of N+ epi 136, where opposite doping means "P" doping versus "N" doping, with appropriate concentration of dopants for the intended purpose.

Figure 11:
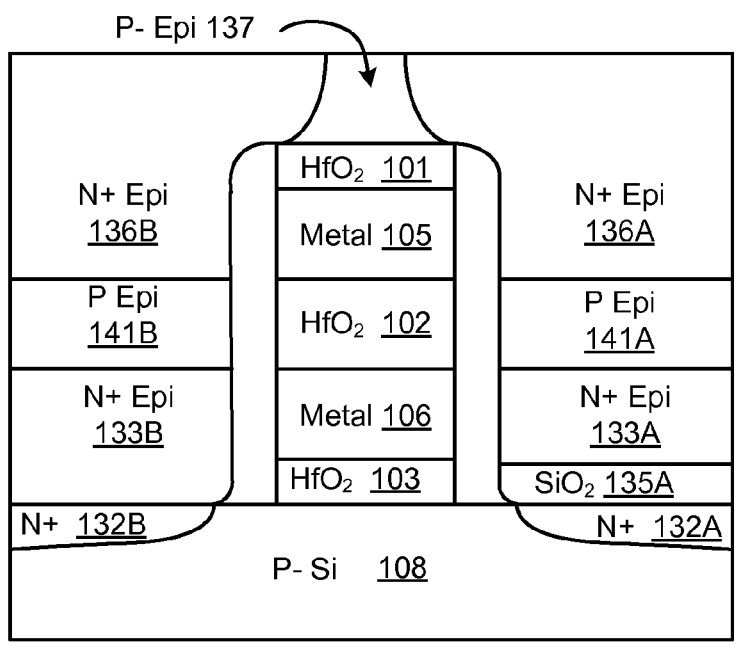
FIG. 11 shows the structure of FIG. 10 after planarization which removes the fourth epitaxial layer except for a remaining portion of the fourth epitaxial layer above the top dielectric layer.

FIG. 11 shows the structure of FIG. 10, following planarization, such as chemical/mechanical polishing or similar process. The planarization removes P− epi 137 except for an area above the top surface of HfO$_2$ 101. The remaining P− epi 137 forms a body of a second NFET; HfO$_2$ 101 forms a gate dielectric of the second NFET. N+ epi 136 forms source/drain regions N+ epi 136A and 136B for the second NFET; metal 105 forms a gate electrode of the second NFET.

FIG. 12 shows the structure of FIG. 11 following a first etch of a lined contact 150 (the "lining" being a dielectric described below). Lined contact 150 is formed by a process comprising etches through N+ epi 136A, P epi 141A, and N+ epi 133A, followed by a second etch through $SiO_2$ 135A to expose N+ 132A.

FIG. 13 shows the structure of FIG. 12 following deposition of a dielectric material lining around the vertical surfaces of lined contact 150. The dielectric material lining is shown as $SiO_2$ liner 151. $SiO_2$ liner 151 may, in embodiments, use a dielectric other than $SiO_2$, so long as the dielectric is compatible with the processing steps described herein. Deposition of $SiO_2$ liner 151 will also form $SiO_2$ on source/drain region 132A, and that $SiO_2$ is removed by anisotropic etching so that source/drain region 132A is exposed under lined contact 150.

Figure 14:
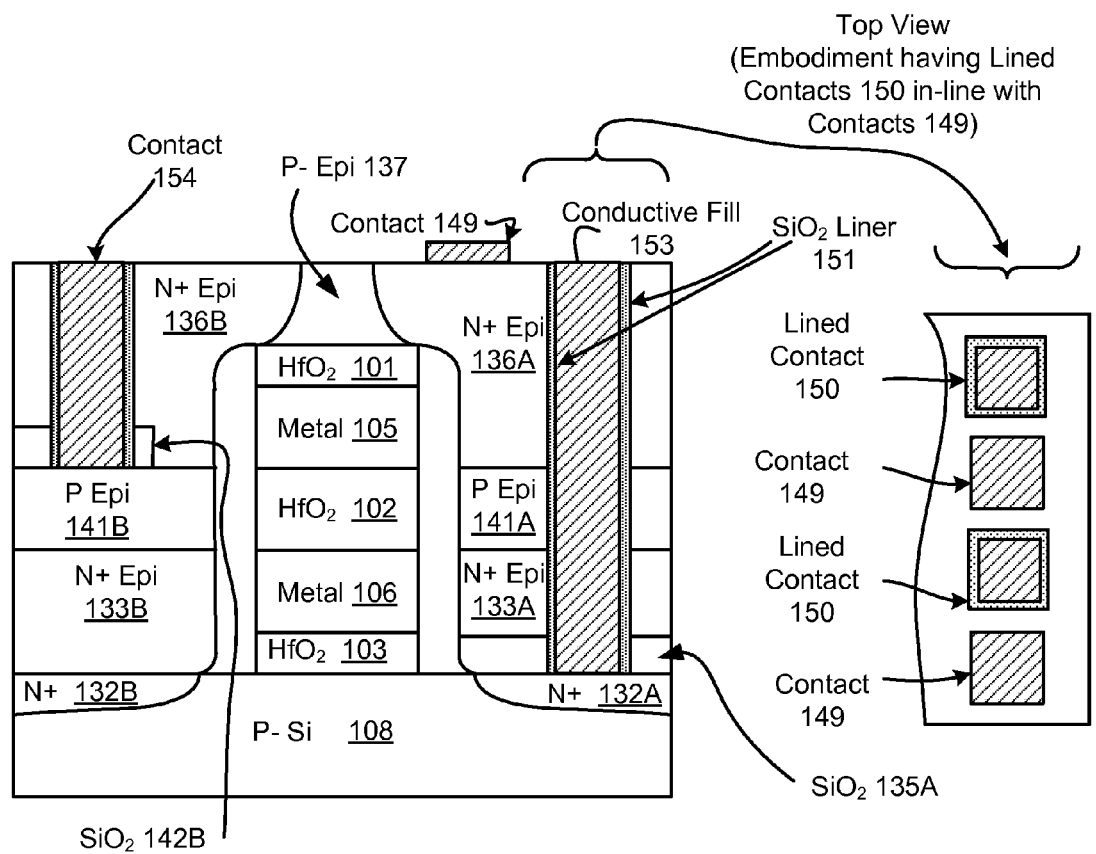
FIG. 14 shows the lined contact hole filled with a conductive fill. A contact has been made as shown for making contact to the source or drain area not contacted by the lined contact hole. A similarly made (Oxygen implant to create an oxide, creation of a hole, deposition of a dielectric liner, removal of a bottom of the dielectric liner) lined contact hole creates a contact to the second epitaxial layer. A top view shows a placement embodiment of lined contact holes with contacts to the third epitaxial layer.

FIG. 14 shows the structure of FIG. 12 following addition of conductive fill 153 in lined contact 150. $SiO_2$ 135A and $SiO_2$ liner 151 electrically isolates the source/drain region 132A from the N+ epi 133A.

Lined contact 154 is added, as shown, through N+ epi 136B. Lined contact 154 is connected to P epi 141B using a process similar to that used to created lined contact 150. In particular, since P epi 141B is relatively thin, and a timed etches through silicon (N+ epi 136B) would make it difficult (but perhaps not impossible) to stop the etch when reaching P Epi 141B. Therefore, a $SiO_2$ 142B layer is implanted, using masking and an oxygen implant similar to that shown in FIG. 8, through N+ epi 136B to serve as an etch stop. A subsequent $SiO_2$ etch then opens the etched hole to a top of P Epi 141B. Similar to lined contact hole 150, $SiO_2$ is grown on the sides (and bottom) of the etched hole, and the $SiO_2$ at the bottom of the etched hole is removed using an anisotropic $SiO_2$ etch. Lined contact 154 is filled with a conducting material such as polysilicon or tungsten.

In FIG. 14, a contact 149 is made to N+ epi 136A, and, in an embodiment, contact 149 may be placed as shown, that is, closer to the remaining P– epi (body of the second FET) than is the lined contact hole 150. However, in other embodiments, one or more lined contact holes 150 may be alternated with one or more contacts 149 as shown in the "top view" in FIG. 14, wherein the one or more lined contact holes 150 are approximately lined up with contacts 149 in order to make the layout more compact.

Note that, as shown, P epi 141A and N+ epi 133A are "floating". If ground rules in a particular design system do not allow floating elements such as these, contact 149 may be modified to use an unlined contact hole that would connect N+ epi 136A, P epi 141A, and N+ epi 133A by simply etching a hole through those silicon layers, and filling the hole with a conducting material such as polysilicon or tungsten, thereby shorting N+ epi 136A, P epi 141A, and N+ epi 133A.

Figure 15:
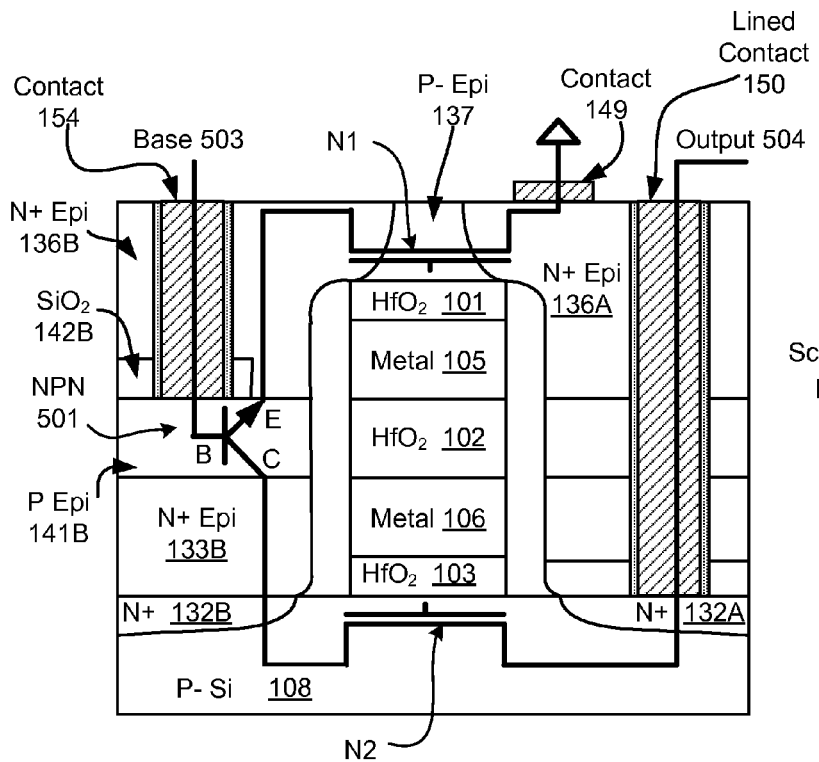
FIG. 15 shows, schematically, two NFETs (N-channel Field Effect Transistors) and an NPN BJT connected in series, suitable for an NFET portion of a NOR circuit.

FIG. 15 shows the structure of FIG. 14, including a schematic of an NFET N1, an NPN BJT 501, and an NFET N2 overlaid on the structure of FIG. 14. Contact 149 is connected to Gnd, and, for clarity in showing connections, contact 149 is shown not "lined up" with lined contact hole 150. N+ epi 136A (FIG. 14) is a source of N1. P– epi 137 (FIG. 11) is a body of N1. N+ epi 136B (FIG. 14) is a drain of N1. Metal 105 is a gate electrode of N1 and may be connected to a logical source of voltage by way of contacts or interconnections of metal 105. N+ epi 136B is an emitter of NPN 501. P epi 141B is a base of NPN 501 and is connected to base 503 which may be further connected to logic voltages to control NPN 501. N+ epi 133B is a collector of NPN 501. N+ 132B (connected electrically to N+ epi 133B) is a source of N2. P—Si 108 is a body of N2. N+ epi 132A is a drain of N2 and is connected to output 504 through lined contact hole 150. Metal 106 is a gate electrode of N2 and may be connected to a source of logical voltage using contacts or interconnections of metal 106. The series circuitry shown in FIG. 15 may be used in a CMOS NAND circuit, or may be used to discharge (pull down) a node connected to output 504.

Figure 16:
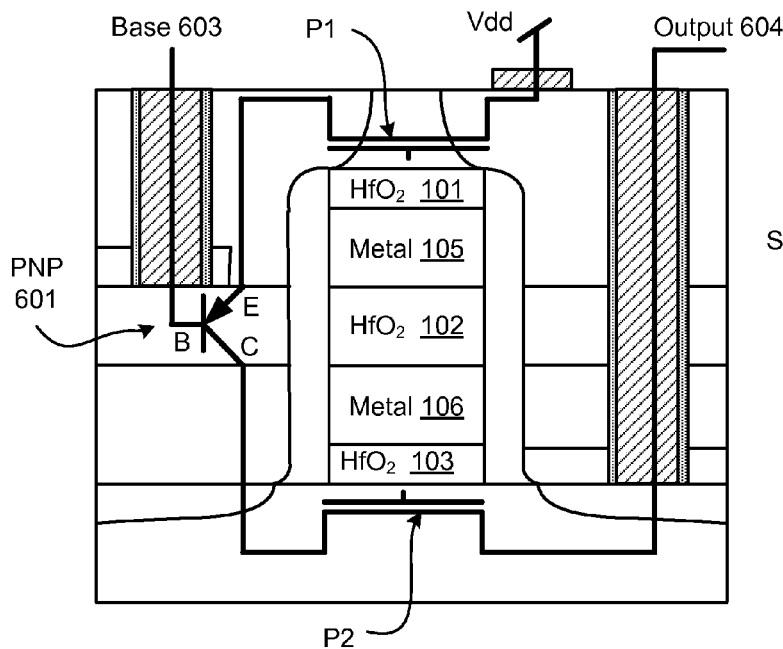
FIG. 16 shows, schematically, two PFETs (P-Channel Field Effect Transistors) and a PNP BJT connected in series, suitable for a PFET portion of a NOR circuit.

FIG. 16 shows a schematic analogous to that of FIG. 15 where dopants have been altered in order to create PFET FETs and a PNP BJT. For example, N+ regions are P+ regions in FIG. 16; N– regions become P–; P becomes N. Reference numbering of the various epitaxial layers and oxide layers used for etch stops have been omitted for clarity in depicting the schematic. A source of P1 is connected to Vdd; a body of P1 is a portion of a N– epitaxial growth analogous to P– epitaxial growth 137. A drain of P1 is connected to an emitter of PNP 601. A collector of PNP 601 is connected to a source of P2. A body of P2 is an N– region that may be an N– well in a P– substrate. A drain of P2 is connected to output 604 through a lined contact. Such a structure may be used in CMOS circuitry to provide pull up in a NOR circuit, or may be used, with three logical inputs (e.g., voltages on Base 603, metal 105, and metal 106) to precharge capacitance, such as a bit line in an SRAM quickly.

Figure 17:
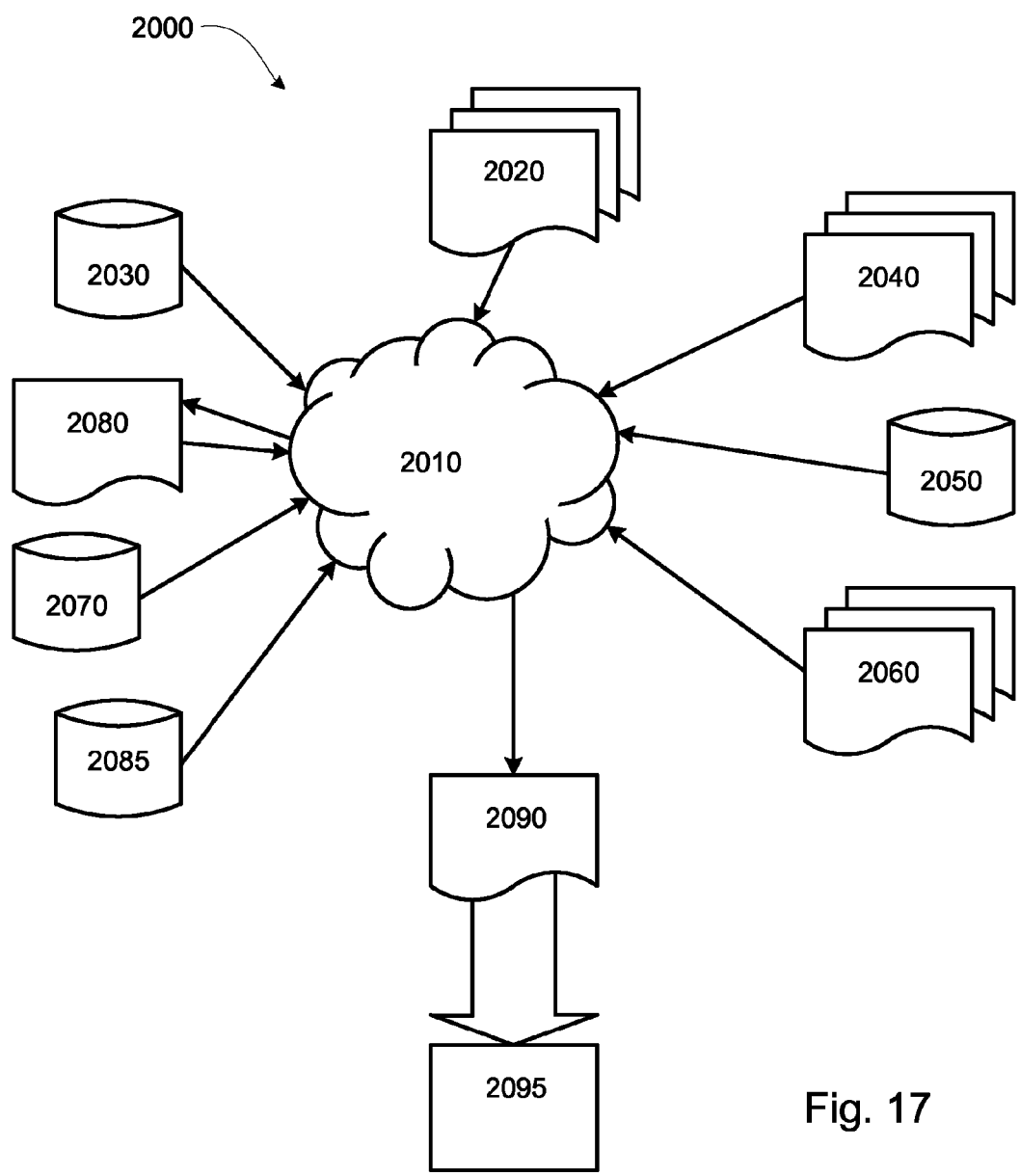
FIG. 17 shows a design flow including a design structure for creating a first FET, a BJT, and a second FET connected in series on a vertical structure.

FIG. 17 shows a block diagram of an example design flow 2000 that may be used for designing, creating, and testing the series-connected apparatus described herein, comprising a first FET, a BJT, and a second FET. Design flow 2000 may vary depending on the type of integrated circuit being designed. For example, a design flow 2000 for a static random access memory may differ from a design flow 2000 for a dynamic random access memory. In addition, design flow 2000 may differ for different semiconductor processes. Design structure 2020 is preferably an input to a design process 2010 and may come from an IP provider, a core developer, or other design company or may be generated by the operator of the design flow, or from other sources. Design structure 2020 comprises circuits described above, for examples in FIGS. 1-16 in the form of schematics or HDL (High Level Design Language), a hardware-description language (e.g., Verilog, VHDL, C, etc.). Design structure 2020 may be contained on one or more tangible computer readable medium. For example, design structure 2020 may be a text file or a graphical representation of circuits described above. Examples of tangible computer readable medium include hard disks, floppy disks, magnetic tapes, CD ROMs, DVD, flash memory devices, and the like. Design process 2010 preferably synthesizes (or translates) the circuits described above into a netlist 2080, where netlist 2080 is, for example, a list of wires, transistors, logic gates, control circuits, I/O, models, etc. that describes the connections to other elements and circuits in an integrated circuit design and recorded on the at least one computer readable medium. This may be an iterative process in which netlist 2080 is resynthesized one or more times depending on design specifications and parameters for the circuit.

Design process 2010 may include using a variety of inputs; for example, inputs from library elements 2030 which may house a set of commonly used elements, circuits, and devices, including models, layouts, and symbolic representations, for a given manufacturing technology (e.g., different technology nodes, 32 nm, 45 nm, 90 nm, etc.), design specifications 2040, characterization data 2050, verification data 2060, design rules 2070, and test data files 2085 (which may include test patterns and other testing information). Design process 2010 may further include, for example, standard circuit design processes such as timing analysis, verification, design rule checking, place and route operations, etc. One of ordinary skill in the art of integrated circuit design can appreciate the extent of possible electronic design automation tools and applications used in design process 2010 without deviating from the scope and spirit of the invention. The design structure of the invention is not limited to any specific design flow.

Design process 2010 preferably translates an embodiment of the invention as shown in the various logic diagrams and the underlying circuitry, along with any additional integrated circuit design or data (if applicable), into a second design structure 2090. Design structure 2090 resides on a tangible computer readable storage medium in a data format used for the exchange of layout data of integrated circuits (e.g. information stored in a GDSII (GDS2), GL1, OASIS, or any other suitable format for storing such design structures). Design structure 2090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the logic diagrams in the figures. Design structure 2090 may then proceed to a stage 2095 where, for example, design structure 2090 proceeds to tape-out, is released to manufacturing, is released to a mask house, is sent to another design house, is sent back to the customer, etc.

Furthermore, it should be understood that at least some aspects of the present invention, including those described with reference to FIG. 17, may alternatively be implemented in a program product. Programs defining functions of the present invention can be delivered to a data storage system or a computer system via a variety of tangible signal-bearing media (e.g., a floppy disk, hard disk drive, read/write CD ROM, DVD, optical media), and communication media, such as computer and telephone networks including Ethernet. It should be understood, therefore, in such signal-bearing tangible media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

What is claimed is:

1. A method for making independently controllable vertically stacked Field Effect Transistors (FETs) and a bipolar junction transistor (BJT) comprising:

forming, on a semiconductor substrate, a vertical structure comprising a first gate dielectric layer, a first conductor layer, a second dielectric layer, a second conductor layer, and a third dielectric layer;

implanting into the semiconductor substrate a first source and a first drain, each having a first doping type, for a first FET of the vertically stacked FETs, the semiconductor substrate forming a first body for the first FET, the first conductor layer forming a gate electrode for the first FET;

growing, over the first source and the first drain, a first epitaxial layer having a doping type similar to the first doping type;

growing, over the first epitaxial layer, a second epitaxial layer having a second doping type opposite the first doping type, thereby forming a base for the BJT;

growing, over the second epitaxial layer, a third epitaxial layer having a third doping of similar type as the first doping type, thereby forming a drain and a source for a second FET of the vertically stacked FETs, the second conducting layer forming a gate electrode for the second FET;

creating an isolation between the first source and an overlying portion of the first epitaxial layer;

connecting the drain of the first FET to a contact for an output;

connecting the source of the first FET to a collector of the BJT;

connecting an emitter of the BJT to the drain of the second FET;

connecting the first conductor layer to a first signal source;

connecting the second conductor layer to a second signal source;

connecting the base of the BJT to a third signal source and connecting the source of the second FET to a voltage supply.

* * * * *